(12) United States Patent
Li

(10) Patent No.: US 9,936,605 B2
(45) Date of Patent: Apr. 3, 2018

(54) CONTROLLING AIR FLOW IN A SERVER RACK

(71) Applicant: Quanta Computer Inc., Taoyuan (TW)

(72) Inventor: Yung-Fu Li, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 214 days.

(21) Appl. No.: 14/953,991

(22) Filed: Nov. 30, 2015

(65) Prior Publication Data
US 2017/0156238 A1 Jun. 1, 2017

(51) Int. Cl.
*H05K 7/20* (2006.01)
*G05B 15/02* (2006.01)

(52) U.S. Cl.
CPC ........ *H05K 7/20209* (2013.01); *G05B 15/02* (2013.01); *H05K 7/20736* (2013.01); *H05K 7/20836* (2013.01)

(58) Field of Classification Search
CPC .................. H05K 7/20209; G05B 15/02
See application file for complete search history.

(56) References Cited

U.S. PATENT DOCUMENTS

| | | | | |
|---|---|---|---|---|
| 8,656,003 B2* | 2/2014 | Yu | ............... | H05K 7/20836 709/223 |
| 9,232,678 B2* | 1/2016 | Bailey | ............... | H05K 7/1489 |
| 9,385,920 B1* | 7/2016 | Chen | ............... | H04L 43/10 |
| 9,582,010 B2* | 2/2017 | Mick | ............... | G05D 23/1917 |
| 9,594,385 B2* | 3/2017 | Mick | ............... | G05D 23/1917 |
| 9,732,747 B2* | 8/2017 | Lin | ............... | F04B 53/08 |
| 2013/0031411 A1* | 1/2013 | Chou | ............... | G06F 11/2294 714/30 |
| 2013/0110926 A1* | 5/2013 | Yu | ............... | H05K 7/20836 709/204 |
| 2013/0138788 A1* | 5/2013 | Wang | ............... | H04L 41/04 709/223 |
| 2013/0138803 A1* | 5/2013 | Wang | ............... | H04L 43/0817 709/224 |
| 2014/0277784 A1* | 9/2014 | Mick | ............... | G05D 23/1917 700/286 |
| 2014/0277819 A1* | 9/2014 | Mick | ............... | G05D 23/1917 700/300 |
| 2014/0281614 A1* | 9/2014 | Mick | ............... | G05D 23/1917 713/322 |
| 2015/0253794 A1* | 9/2015 | Palmer | ............... | H05K 7/1498 700/297 |

(Continued)

Primary Examiner — Ramesh Patel
(74) Attorney, Agent, or Firm — Nixon Peabody LLP; Eduardo J. Quinones; Zhou Lu

(57) ABSTRACT

A method for controlling air flow in a server rack includes storing, by a switch, a connection table, the connection table comprising information for rack positions corresponding to switch ports of the switch. The switch obtains address information of at least one management controller corresponding to at least one device connected to the switch ports of the switch. The switch determines a rack position for each of the at least one device, based on the table and the address information. The switch receives from a rack management controller (RMC), a request for the rack position for each of the at least one device. The switch sends to the RMC, the rack position for each of the at least one device. The RMC controls fan speed for the at least one device, based on the rack position for each of the at least one device.

20 Claims, 6 Drawing Sheets

(56) References Cited

U.S. PATENT DOCUMENTS

| | | | |
|---|---|---|---|
| 2015/0256386 A1* | 9/2015 | Palmer | F24F 11/006 709/220 |
| 2015/0256396 A1* | 9/2015 | Palmer | H04L 41/0806 709/221 |
| 2016/0365109 A1* | 12/2016 | Li | G11B 19/28 |
| 2017/0075676 A1* | 3/2017 | Li | G06F 8/71 |
| 2017/0126505 A1* | 5/2017 | Cencini | G06K 7/10366 |

* cited by examiner

FIG. 2

210 STORING, BY A SWITCH, A CONNECTION TABLE, THE CONNECTION TABLE COMPRISING INFORMATION FOR RACK POSITIONS CORRESPONDING TO SWITCH PORTS OF THE SWITCH

220 OBTAINING, BY THE SWITCH, ADDRESS INFORMATION OF A MANAGEMENT CONTROLLER OF EACH OF AT LEAST ONE DEVICE CONNECTED TO THE SWITCH PORTS OF THE SWITCH

230 DETERMINING, BY THE SWITCH, A RACK POSITION FOR EACH OF THE AT LEAST ONE DEVICE, BASED ON THE TABLE AND THE ADDRESS INFORMATION

240 RECEIVING, BY THE SWITCH FROM A RACK MANAGEMENT CONTROLLER (RMC), A REQUEST FOR THE RACK POSITION FOR EACH OF THE AT LEAST ONE DEVICE

250 SENDING, BY THE SWITCH TO THE RMC, THE RACK POSITION FOR EACH OF THE AT LEAST ONE DEVICE

260 CONTROLLING, BY THE RMC, FAN SPEED FOR THE AT LEAST ONE DEVICE, BASED ON THE RACK POSITION FOR EACH OF THE AT LEAST ONE DEVICE

310 — STORING, BY A RACK MANAGEMENT CONTROLLER (RMC), A CONNECTION TABLE, A CONNECTION TABLE COMPRISING INFORMATION FOR RACK POSITIONS CORRESPONDING TO SWITCH PORTS OF A SWITCH

320 — OBTAINING, BY THE SWITCH, ADDRESS INFORMATION OF A MANAGEMENT CONTROLLER OF EACH OF AT LEAST ONE DEVICE CONNECTED TO THE SWITCH PORTS OF THE SWITCH

330 — OBTAINING, BY THE RMC FROM THE SWITCH, THE ADDRESS INFORMATION

340 — DETERMINING, BY THE RMC, A RACK POSITION FOR EACH OF THE AT LEAST ONE DEVICE, BASED ON THE TABLE AND THE ADDRESS INFORMATION

350 — CONTROLLING, BY THE RMC, FAN SPEED FOR THE AT LEAST ONE DEVICE, BASED ON THE RACK POSITION FOR EACH OF THE AT LEAST ONE DEVICE

FIG. 4       400

| PORT NUMBER | RACK POSITION | IP ADDRESS |
|---|---|---|
| 1 | 1 | 192.168.8.1 |
| 2 | 2 | 192.168.8.4 |
| 3 | 3 | 192.168.8.6 |
| 4 | 4 | 192.168.8.8 |
| 5 | 5 | 192.168.8.12 |
| ... | ... | ... |
| 48 | 48 | 192.168.8.38 |

FIG. 5       500

| PORT NUMBER | RACK POSITION | IP ADDRESS |
|---|---|---|
| 1 | 1, 2 | 192.168.8.1 |
| 2 | 3 | 192.168.8.4 |
| 3 | 5 | 192.168.8.6 |
| 4 | 8 | 192.168.8.8 |
| 5, 6 | 6 | 192.168.8.12 |
| ... | ... | ... |
| 10 | 24 | 192.168.8.38 |

CONTROLLING AIR FLOW IN A SERVER RACK

BACKGROUND

Technical Field

This application relates to computer systems, and more particularly to a system and method for controlling air flow in a server rack.

Background

Computer server systems in modern data centers are commonly mounted in specific configurations on server racks for which a number of computing modules, such as server trays, server chassis, server sleds, server blades, etc., are positioned and stacked relative on top of each other within the server racks. Rack mounted systems allow for vertical arrangement of the computing modules to use space efficiently. Generally, each computing module can slide into and out of the server rack, and various cables such as input/output (JO) cables, network cables, power cables, etc., connect to the computing modules at the front or rear of the rack. Each computing module contains one or more computer servers or may hold one or more computer server components. For example computing modules includes hardware circuitry for processing, storage, network controllers, disk drives, cable ports, power supplies, etc.

A server rack may include a large number of fans for cooling the server rack. The fans are controlled by a rack management controller (RMC). If the RMC knows where the fans are positioned in the server rack, the RMC can use the fan position information to control fan speed based on temperature and/or load of devices in various positions in the server rack.

SUMMARY

The following presents a simplified summary of one or more embodiments in order to provide a basic understanding of present technology. This summary is not an extensive overview of all contemplated embodiments of the present technology, and is intended to neither identify key or critical elements of all examples nor delineate the scope of any or all aspects of the present technology. Its sole purpose is to present some concepts of one or more examples in a simplified form as a prelude to the more detailed description that is presented later.

In some implementations, a method for determining server position in a server rack includes storing, by a switch, a connection table, the connection table comprising information for rack positions corresponding to switch ports of the switch. The switch obtains address information of at least one management controller corresponding to at least one device connected to the switch ports of the switch. The switch determines a rack position for each of the at least one device, based on the table and the address information. The switch receives from a rack management controller (RMC), a request for the rack position for each of the at least one device and switch sends to the RMC, the rack position for each of the at least one device. The RMC controls fan speed for the at least one device, based on the rack position for each of the at least one device.

In some implementations, a method includes storing, by a rack management controller (RMC), a connection table, a connection table comprising information for rack positions corresponding to switch ports of a switch. The switch obtains address information of a management controller of each of at least one device connected to the switch ports of the switch. The RMC obtains from the switch, the address information and determines a rack position for each of the at least one device, based on the table and the address information. The RMC controls fan speed for the at least one device, based on the rack position for each of the at least one device.

In some implementations, a system includes at least one device, each corresponding to a rack position in the server rack. The system includes a switch connected to each of the at least one device. The system includes a rack management controller (RMC) configured to send a request to the switch for a rack position for each of the at least one device and control fan speed for the at least one device, based on the rack position for each of the at least one device. The switch is configured to: store a connection table, the connection table comprising information for rack positions corresponding to switch ports of the switch, obtain address information of a management controller of each of at least one device connected to the switch ports of the switch, determine the rack position for each of the at least one device, based on the table and the address information, and send, to the RMC, the rack position for each of the at least one device.

BRIEF DESCRIPTION OF THE DRAWINGS

These and other sample aspects of the present technology will be described in the detailed description and the appended claims that follow, and in the accompanying drawings, wherein:

FIG. 2 illustrates an example methodology for controlling air flow in a server rack;

FIG. 3 illustrates another example methodology for controlling air flow in a server rack;

FIG. 4 illustrates an example table matching switch ports to rack positions and device addresses;

FIG. 5 illustrates another example table matching switch ports to rack positions and device addresses;

DETAILED DESCRIPTION

The subject disclosure provides techniques for controlling air flow in a server rack. Various aspects of the present technology are described with reference to the drawings. In the following description, for purposes of explanation, numerous specific details are set forth in order to provide a thorough understanding of one or more aspects. It is evident, however, that the present technology can be practiced without these specific details. In other instances, well-known structures and devices are shown in block diagram form in order to facilitate describing these aspects.

A server rack may include a large number of fans for cooling the server rack. The fans are controlled by a rack management controller (RMC). The RMC has knowledge of where the fans are positioned in the server rack. The RMC can use this position information to control fan speed based on temperature and/or load of devices in various positions in the server rack. The subject disclosure provides a method of automatically determining the rack position of each device in the server rack without the use of conventional connection boards and cables, which require space and increase complexity and cost. The method allows for the RMC to control fan speed using the rack positions of the devices in the server rack.

Figure 1:
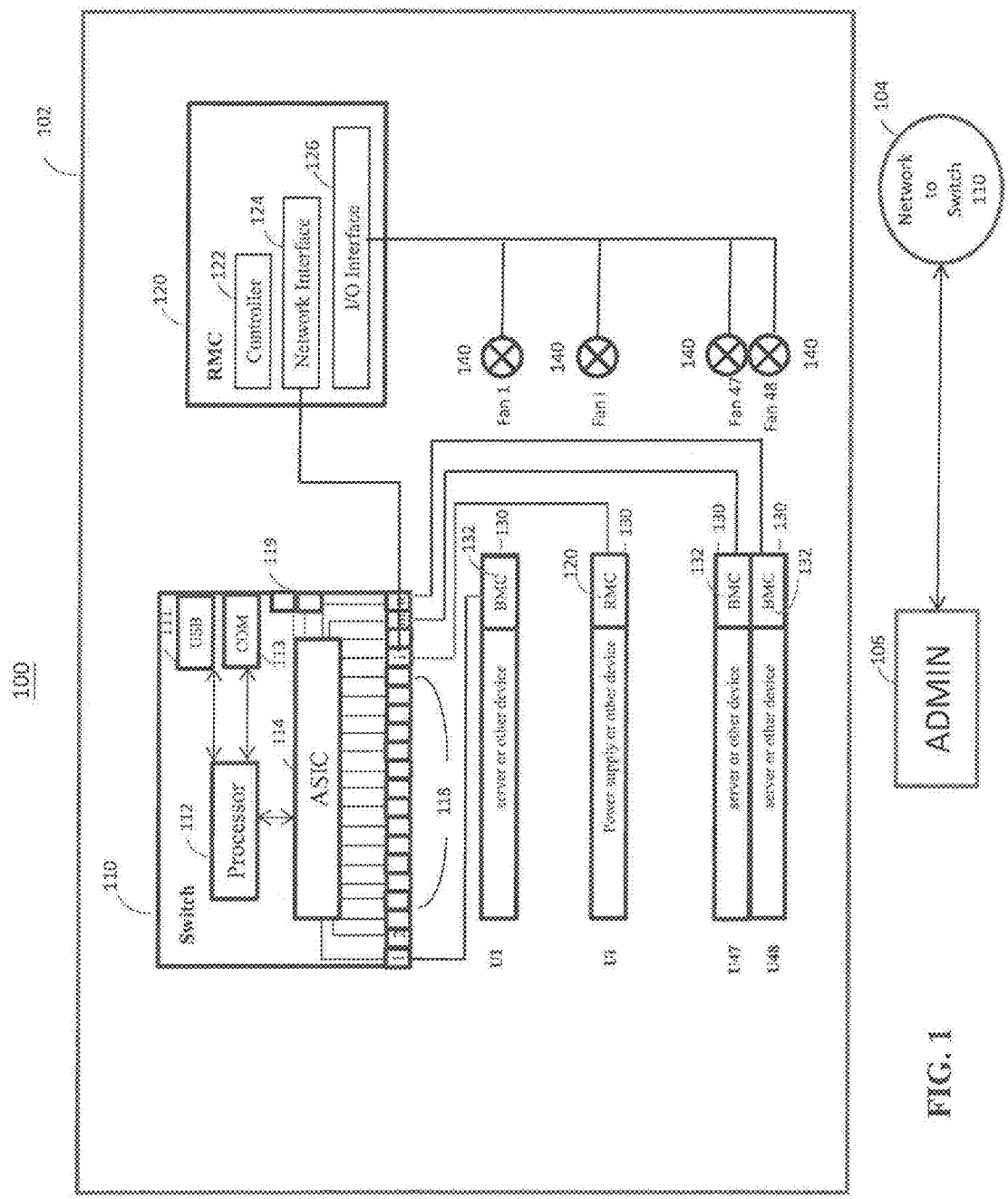
FIG. 1 illustrates a block diagram of an example system for controlling air flow in a server rack.

FIG. 1 illustrates a block diagram of an example system 100 for controlling air flow in a server rack 102. The system 100 includes a server rack 102, and in some implementations, a network 104 and an administrator device 106. The server rack 102 includes a switch 110, a rack management controller (RMC) 120, a multitude of servers or other devices 130, and a multitude of fans 140. In some implementations, the switch 110 and the RMC 120 are a common component. In some aspects, each of the at least one device is one of a server, a network device, a power supply unit, or a storage device.

The switch 110 is connected to the RMC 120 and each of the devices 130. The switch 110 determines where each of the devices 130 are located within the server rack 102 and communicates the rack positions of the devices 130 to the RMC 120. The RMC 120 connects to and controls each of the fans 140 that cool the devices 130. Certain fans 140 are physically positioned close to certain devices 130 and have more of an impact on the cooling of those certain devices 130 that are closely positioned. The RMC 120 uses the rack position information obtained from the switch 110 to control the fans 140.

Each of the devices 130 includes a management controller such as a baseboard management controller (BMC) 132. The BMC 132 includes a microcontroller that manages interfaces between system management software and platform hardware. The BMC 132 monitors different types of sensors built into the device on parameters such as temperature, cooling fan speeds (i.e., for both fans internal to the device and fans 140 for the server rack 102), power status, load status, operating system status, etc. When the device 130 is a server, the BMC 132 preferably communicates with various server components that the BMC 132 manages using the IPMI protocol. IPMI is a set of specifications for an autonomous computer subsystem that manages and monitors a computer system's CPU, firmware, and OS, and for out-of-band management and monitoring by system administrators. The BMC 132 can connect to various server components (e.g., southbridge or network controller) using any bus interface such as the system management bus (SMBus), RS-232 serial bus, IIC protocol, Ethernet, IPMB, low-pin count (LPC) bus, Enhanced Serial Peripheral Interface (eSPI), etc.

The switch 110 (e.g., an Ethernet switch) is a device used on a computer network to physically connect devices together. Multiple cables are connected to a switch to enable networked devices to communicate with each other. Switches manage the flow of data across a network by only transmitting a received message to the device for which the message was intended. Each networked device connected to a switch is identified using a media access control (MAC) address, allowing the switch to regulate the flow of traffic. Switches include an application specific integrated circuit (ASIC) 114 to build and maintain MAC address tables. The ASIC 114 routes data between the switch ports 118 the switch processor 112 and the upstream port 119.

The switch 110 includes a switch processor 112, input/output (I/O) interface such as a universal serial bus (USB) 111 and a communication port 113, an application-specific integrated circuit (ASIC) 114, multiple switch ports 118, and an upstream port 119. The switch ports 118 connect to different and corresponding devices 130. The upstream port 119 connects to an upper layer network. For example, an administrator 106 can connect to the switch 110 through the upstream port 119 from the upper layer network to manage multiple racks 102 at the same time.

In some implementations, the switch 110 stores a connection table including information for rack positions corresponding to switch ports of the switch. The switch 110 obtains address information of the BMC 132 in of each of the devices 130 connected to the switch ports 118 of the switch 110. For example, the address information of a BMC 132 includes an Internet Protocol (IP) address of the BMC 132. An IP address is a numerical label assigned to each device (e.g., computer, printer) participating in a computer network that uses the Internet Protocol for communication. An IP address serves two principal functions: host or network interface identification and location addressing. The switch 110 uses the connection table and the address information to determine a rack position for each of the devices 130 in the server rack 102. In some aspects, the address information includes an IP address of the management controller of each of the at least one device.

The switch 110 receives a connection table through the I/O interface 111, 113. For example, the connection table can be sent to the 110 as a file or can be inputted by an administrator. In some implementations, the switch 110 includes a default connection table and does not require receiving a connection table.

In some aspects, the switch 110 receives user input defining the connection table according to how the devices are connected to the switch ports 118. In some aspects, the connection table is predefined by default and the at least one device 130 is connected to the switch ports according to the connection table. In some aspects, the RMC 120 obtains the connection table and sends the connection table to the switch.

The RMC 120 of the server rack 102 is a microcontroller that manages the entire server rack 102. The RMC 120 can monitor the health and status of the rack server using various sensors, manage server rack power supply units (PSUs), fans 140, as well as communicate over the switch 110. For example, the RMC 120 can report the health and status, system logs, or error messages to the administrator device 106. The RMC 120 can also receive commands from the administrator device 106, such as commands to change fan speeds of the fans 140.

The sensors allow the RMC 120 to monitor the health and status of the server rack 102, such as temperature sensors, vibration sensors, and voltage sensors. The sensors can be directly monitored by the RMC 120, or can be monitored by the BMCs 132 of the devices 130, which then report the sensor data to the RMC 120.

The RMC 120 includes a controller 122, a network interface 124, and an I/O interface 126. The controller 122 is configured for managing the server rack 102, which includes managing fan speed of the fans 140. The network interface 124 communicates with the switch 110 by connecting to the downstream ports 118 or upstream port 119 of the switch 110. The I/O interface 126 connects to the fans 140.

The RMC 120 obtains the rack position information of each of the devices 130 from the switch 110. The RMC 120 uses the rack position information obtained from the switch 110 to control the fans 140. In some aspects, the fan speed corresponds to one or more fans nearest to one of the at least one device 130.

In some other implementations, the RMC 120, instead of the switch 110, stores the connection table and determines the rack positions of the devices 130 in the server rack 102. The RMC 120 obtains the address information of the BMC from the switch 110. The RMC 120, instead of the switch 110, uses the connection table and the address information to determine a rack position for each of the devices 130 in the server rack 102.

In some aspects, the RMC 120 obtains at least one of temperature or load information for each of the at least one device. In some aspects, the RMC 120 obtains the at least one of temperature or load information from the at least one management controller corresponding to the at least one device according to the address information of the BMC 132.

FIG. 2 illustrates an example methodology 200 for controlling air flow in a server rack. At step 210 a switch stores a connection table, the connection table comprising information for rack positions corresponding to switch ports of the switch.

At step 220 the switch obtains address information of a management controller (e.g., a BMC or other controller) of each of at least one device connected to the switch ports of the switch.

At step 230, the switch determines a rack position for each of the at least one device, based on the table and the address information.

At step 240, the switch receives from a rack management controller (RMC), a request for the rack position for each of the at least one device.

At step 250, the switch sends to the RMC, the rack position for each of the at least one device.

At step 260, the RMC controls fan speed for the at least one device, based on the rack position for each of the at least one device.

In some aspects, the fan speed corresponds to one or more fans nearest to one of the at least one device.

FIG. 3 illustrates another example methodology 300 for controlling air flow in a server rack. The method 300 involves, at step 310, storing, by a rack management controller (RMC), a connection table, a connection table comprising information for rack positions corresponding to switch ports of a switch.

At step 320, the switch obtains address information of a management controller of each of at least one device connected to the switch ports of the switch. In some aspects, the address information includes an Internet Protocol (IP) address of the management controller of each of the at least one device.

At step 330, the RMC obtains from the switch, the address information.

At step 340, the RMC determines a rack position for each of the at least one device, based on the table and the address information.

At step 350, the RMC controls fan speed for the at least one device, based on the rack position for each of the at least one device.

FIG. 4 illustrates an example table 400 matching switch ports to rack positions and device addresses. The example connection table 400 includes information for rack positions corresponding to switch ports 118 of the switch 110. The first column of table 400 is a list of switch port numbers. For example, switch port number 1 can represent the left-most switch port 118 of the switch 110; port number 2 can represent the second switch port 118 from the left, etc. The second column of table 400 is a list of rack positions. For example, rack position 1 can represent the top-most rack position in the rack 102; rack position 2 can represent the second rack position down from the top, etc. The total number of switch ports 118 can equal the total number of rack positions or can be different.

In the example table 400, the first switch port corresponds to the first rack position; the second switch port corresponds to the second rack position; the third switch port corresponds to the third rack position; and the forty-eighth switch port corresponds to the forty-eighth rack position.

In some aspects, the switch 110 receives the connection table 400 through the I/O interface 111, 113. For example, the connection table 400 can be sent to the 110 as a file or can be inputted by an administrator. In some implementations, the switch 110 includes a default connection table and does not require receiving a connection table through the I/O interface 111, 113. In some other aspects, the RMC 120 obtains the connection table 400.

In some aspects, address information of the BMC 132 in of each of the devices 130 connected to the switch ports 118 of the switch 110 is added to the connection table 400. The switch 110 obtains the address information. For example, the address information of a BMC 132 includes an Internet Protocol (IP) address of the BMC 132.

FIG. 5 illustrates another example table 500 matching switch ports to rack positions and device addresses. The example connection table 500 includes information for rack positions corresponding to switch ports 118 of the switch 110. The first column of table 500 is a list of switch port numbers. For example, switch port number 1 can represent the left-most switch port 118 of the switch 110; port number 2 can represent the second switch port 118 from the left, etc. The second column of table 500 is a list of rack positions. For example, rack position 1 can represent the top-most rack position in the rack 102; rack position 2 can represent the second rack position down from the top, etc. In the example table 400, the total number of switch ports 118 (i.e., 48) is equal to the total number of rack positions (i.e., 48).

In the example table 500, switch port 1 corresponds to first rack position 1 and the rack position 2 (i.e., the switch port 1 connects to a device mounted on rack position 1-2); switch port 2 corresponds to first rack position 3; switch port 3 corresponds to first rack position 5; switch port 4 corresponds to first rack position 8; switch ports 5-6 correspond to first rack position 6; and switch port 10 corresponds to first rack position 24. The order of the switch ports does not need to match the order of the rack positions.

As shown in the example table 500, it is possible for a single larger device to take up two rack positions (i.e., the device connected switch port 1). In this case, the RMC 120 can control fan speed for fans near multiple rack positions to adequately cool the device taking up multiple rack positions. It is also possible for two smaller devices to be in a single rack position (i.e., rack position 6). In this case, the RMC 120 can control fan speed for fans near a single rack position to adequately cool multiple devices at a single rack position.

In the example table 500, the total number of switch ports 118 (i.e., 10) is less than the total number of rack positions (i.e., 24). It is also possible for a server rack to include more switch ports 118 than rack positions.

Figure 6:
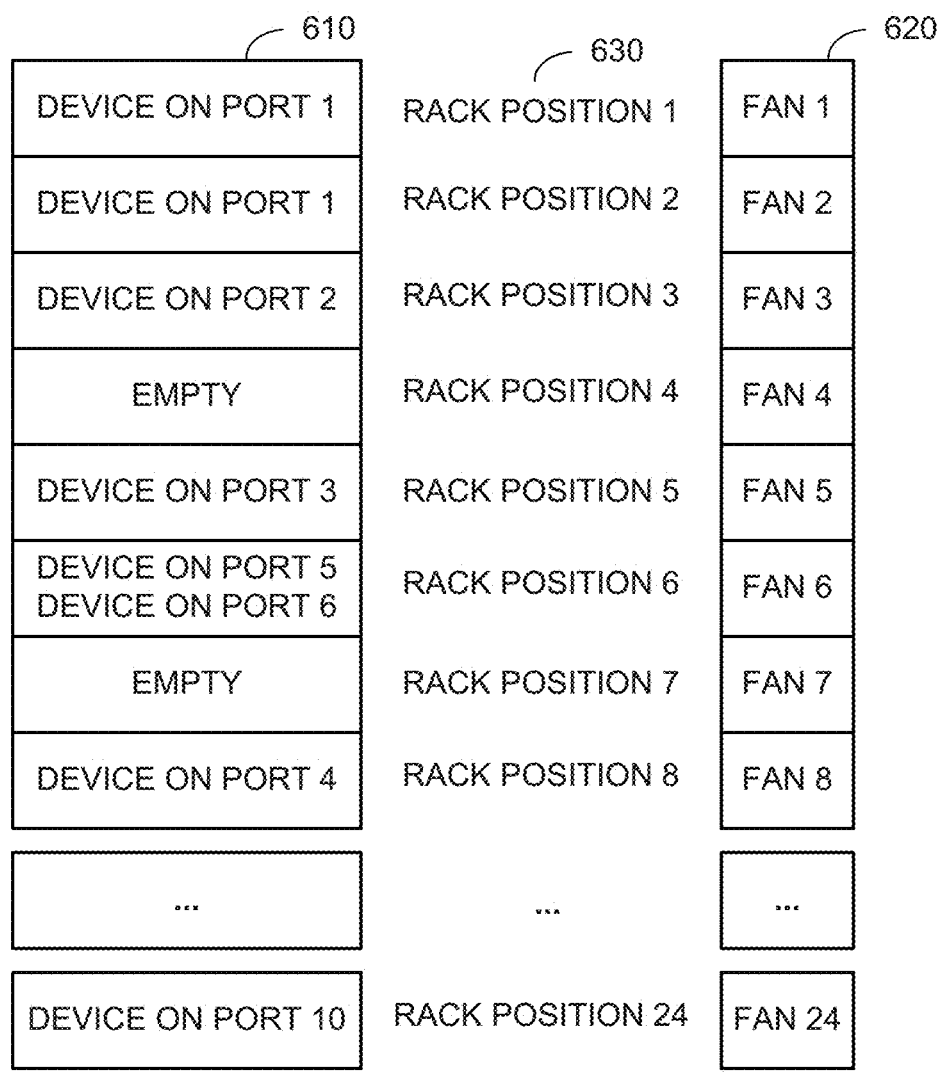
FIG. 6 illustrates a block diagram of an example arrangement of device positions and fan positions in a server rack.

FIG. 6 illustrates a block diagram of an example arrangement 600 of device positions and fan positions in a server rack. For example, each of the devices 610 can be a server, a compute node, a networking node, a storage node, etc. The example arrangement 600 includes ten devices 610, twenty-four rack positions, and twenty-four fan sets 620. Each fan set can include a single cooling fan or multiple cooling fans.

The example arrangement 600 matches with the example connection table 500 of FIG. 5. A device connected to switch port 1 is mounted on rack positions 1-2; a device connected to switch port 1 is mounted on rack position 3; rack position 4 is empty of any device; a device connected to switch port 3 is mounted on rack position 5; a device connected to switch port 5 and a device connected to switch port 6 is mounted on rack position 6; a device connected to switch port 4 is mounted on rack position 8; and a device connected to switch port 10 is mounted on rack position 24. The order of the switch ports does not need to match the order of the rack positions.

The RMC 120 uses the rack position information obtained from the switch 110 to control the fans 140, as shown in FIG. 1. The RMC has knowledge of where the fans 620 are positioned in the server rack. The RMC can use this position information to control fan speed based on temperature and/or load of devices 610 in various positions in the server rack. For example, if the device connected to switch port 3 at rack position 5 is at a higher temperature than the other devices, the RMC will control fan set 5 to operate at a higher fan speed than the other fan sets.

As shown in the arrange 600, it is possible for a single larger device to take up two rack positions (i.e., the device connected switch port 1). In this case, the RMC 120 can control fan speed for fans near multiple rack positions to adequately cool the device taking up multiple rack positions. It is also possible for two smaller devices to be in a single rack position (i.e., rack position 6). In this case, the RMC 120 can control fan speed for fans near a single rack position to adequately cool multiple devices at a single rack position.

Figure 7:
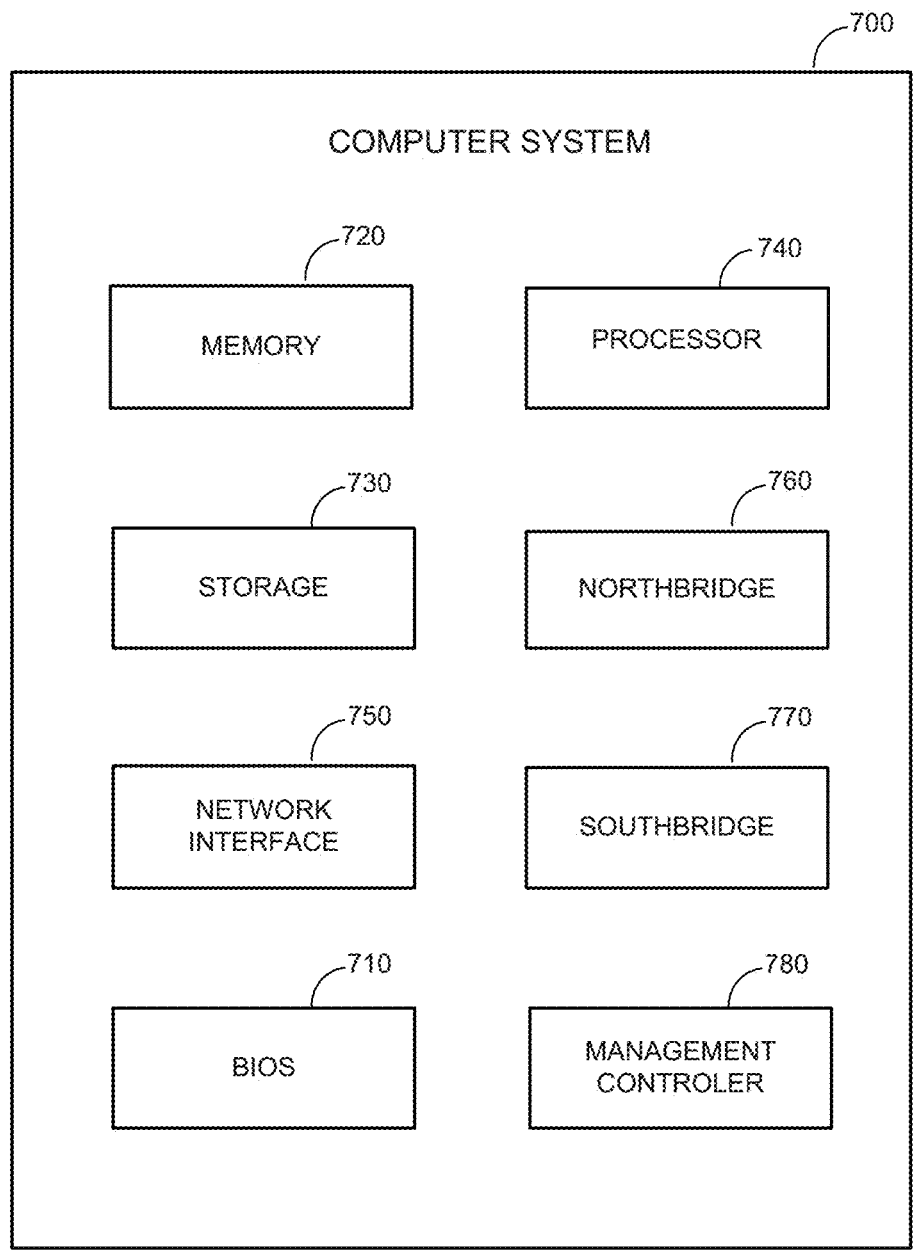
FIG. 7 illustrates a block diagram of an example computer system.

FIG. 7 illustrates a block diagram of an example computer system 700. The computer system 700 includes a processor 740, a network interface 750, a management controller 780, a memory 720, a storage 730, a BIOS 710, a northbridge 760, and a southbridge 770.

The computer system 700 is, for example, a server (e.g., a server in a server rack of a data center) or a personal computer. The processor (e.g., central processing unit (CPU)) 740 is a chip on a motherboard that retrieves and executes programming instructions stored in the memory 720. The processor 740 is a single CPU with a single processing core, a single CPU with multiple processing cores, or multiple CPUs. One or more buses (not shown) transmit instructions and application data between various computer components such as the processor 740, memory 720, storage 730, and networking interface 750.

The memory 720 includes any physical device used to temporarily or permanently store data or programs, such as various forms of random-access memory (RAM). The storage 730 includes any physical device for non-volatile data storage such as a HDD or a flash drive. The storage 730 can have a greater capacity than the memory 720 and can be more economical per unit of storage, but can also have slower transfer rates.

The BIOS 710 includes a Basic Input/Output System or its successors or equivalents, such as an Extensible Firmware Interface (EFI) or Unified Extensible Firmware Interface (UEFI). The BIOS 710 includes a BIOS chip located on a motherboard of the computer system 700 storing a BIOS software program. The BIOS 710 stores firmware executed when the computer system is first powered on along with a set of configurations specified for the BIOS 710. The BIOS firmware and BIOS configurations are stored in a non-volatile memory (e.g., NVRAM) or a ROM such as flash memory. Flash memory is a non-volatile computer storage medium that can be electronically erased and reprogrammed.

The BIOS 710 is loaded and executed as a sequence program each time the computer system 700 is started. The BIOS 710 recognizes, initializes, and tests hardware present in a given computing system based on the set of configurations. The BIOS 710 performs self-test, such as a Power-on-Self-Test (POST), on the computer system 700. This self-test tests functionality of various hardware components such as hard disk drives, optical reading devices, cooling devices, memory modules, expansion cards and the like. The BIOS addresses and allocates an area in the memory 720 in to store an operating system. The BIOS 710 then gives control of the computer system to the OS.

The BIOS 710 of the computer system 700 includes a BIOS configuration that defines how the BIOS 710 controls various hardware components in the computer system 700. The BIOS configuration determines the order in which the various hardware components in the computer system 700 are started. The BIOS 710 provides an interface (e.g., BIOS setup utility) that allows a variety of different parameters to be set, which can be different from parameters in a BIOS default configuration. For example, a user (e.g., an administrator) can use the BIOS 710 to specify clock and bus speeds, specify what peripherals are attached to the computer system, specify monitoring of health (e.g., fan speeds and CPU temperature limits), and specify a variety of other parameters that affect overall performance and power usage of the computer system.

The management controller 780 is a specialized microcontroller embedded on the motherboard of the computer system. For example, the management controller 780 is a baseboard management controller (BMC). The management controller 780 manages the interface between system management software and platform hardware. Different types of sensors built into the computer system report to the management controller 780 on parameters such as temperature, cooling fan speeds, power status, operating system status, etc. The management controller 780 monitors the sensors and has the ability to send alerts to an administrator via the network interface 750 if any of the parameters do not stay within preset limits, indicating a potential failure of the system. The administrator can remotely communicate with the management controller 780 to take some corrective action such as resetting or power cycling the system to restore functionality.

The northbridge 760 is a chip on the motherboard that can be directly connected to the processor 740 or is integrated into the processor 740. In some instances, the northbridge 760 and the southbridge 770 is combined into a single die. The northbridge 760 and the southbridge 770, manage communications between the processor 740 and other parts of the motherboard. The northbridge 760 manages tasks that require higher performance than the southbridge 770. The northbridge 760 manages communications between the processor 740, the memory 720, and video controllers (not shown). In some instances, the northbridge 760 includes a video controller.

The southbridge 770 is a chip on the motherboard connected to the northbridge 760, but unlike the northbridge 760, need not be directly connected to the processor 740. The southbridge 770 manages input/output functions, such as Universal Serial Bus (USB), audio, serial, BIOS, Serial Advanced Technology Attachment (SATA), Peripheral Component Interconnect (PCI) bus, PCI eXtended (PCI-X) bus, PCI Express bus, ISA bus, SPI bus, eSPI bus, SMBus, of the computer system 700. The southbridge 770 connects to or includes within the southbridge 770 the management controller 780, Direct Memory Access (DMAs) controllers, Programmable Interrupt Controllers (PICs), and a real-time clock. In some instances, the southbridge 770 directly connects to the processor 740, such as in the case where the northbridge 760 is integrated into the processor 740.

The networking interface 750 is any interface that supports wired or wireless Local Area Networks (LANs) or Wide Area Networks (WANs), such as Ethernet, Fibre Channel, Wi-Fi, Bluetooth, Firewire, the Internet, etc. For example, the networking interface 750 can include a network interface controller (NIC) for Ethernet. Ethernet has been the most widely used networking standard for connecting computers in both Local Area Networks (LANs) and Wide Area Networks (WANs). Ethernet defines a number of wiring and signaling standards for the physical layer (PHY), through means of network access at the Media Access Control (MAC)/Data Link Layer, and through a common addressing format. Ethernet enabled devices typically communicate by transmitting data packets, which comprise blocks of data that are individually sent and delivered.

The various illustrative logical blocks, modules, and circuits described in connection with the disclosure herein can be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor is a microprocessor, or in the alternative, any conventional processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration.

The operations of a method or algorithm described in connection with the disclosure herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor reads information from, and write information to, the storage medium. In the alternative, the storage medium is integral to the processor. The processor and the storage medium resides in an ASIC. The ASIC resides in a user terminal. In the alternative, the processor and the storage medium resides as discrete components in a user terminal.

In one or more exemplary designs, the functions described is implemented in hardware, software, firmware, or any combination thereof. If implemented in software, the functions are stored on or transmitted over as one or more instructions or code on a non-transitory computer-readable medium. Non-transitory computer-readable media includes both computer storage media and communication media including any medium that facilitates transfer of a computer program from one place to another. A storage media is any available media that can be accessed by a general purpose or special purpose computer. By way of example, and not limitation, such computer-readable media includes RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Disk and disc, as used herein, includes compact disc (CD), laser disc, optical disc, digital versatile disc (DVD), floppy disk and blue ray disc where disks usually reproduce data magnetically, while discs reproduce data optically with lasers. Combinations of the above should also be included within the scope of non-transitory computer-readable media.

The previous description of the disclosure is provided to enable any person skilled in the art to make or use the disclosure. Various modifications to the disclosure will be readily apparent to those skilled in the art, and the generic principles defined herein can be applied to other variations without departing from the scope of the disclosure. Thus, the disclosure is not intended to be limited to the examples and designs described herein, but is to be accorded the widest scope consistent with the principles and novel features disclosed herein.

The invention claimed is:

1. A method for controlling air flow in a server rack, comprising:
    storing, by a switch, a connection table, the connection table comprising information for rack positions corresponding to switch ports of the switch;
    obtaining, by the switch, address information of a management controller of each of at least one device connected to the switch ports of the switch, the address information of the management controller of each device of the at least one device being corresponding to an entry of the connection table;
    determining, by the switch, a rack position for each of the at least one device, based on the table and the address information;
    receiving, by the switch from a rack management controller (RMC), a request for the rack position for each of the at least one device;
    sending, by the switch to the RMC, the rack position for each of the at least one device; and
    controlling, by the RMC, fan speed for the at least one device, based on the rack position for each of the at least one device.

2. The method of claim 1, wherein the address information comprises an Internet Protocol (IP) address of the management controller of each of the at least one device.

3. The method of claim 1, further comprising receiving, by the switch, user input defining the connection table according to how the at least one device is connected to the switch ports.

4. The method of claim 1, wherein the connection table is predefined by default and the at least one device is connected to the switch ports according to the connection table.

5. The method of claim 1, further comprising:
    obtaining, by the RMC, the connection table; and
    sending, by the RMC, the connection table to the switch.

6. The method of claim 1, further comprising obtaining, by the RMC, at least one of temperature or load information for each of the at least one device.

7. The method of claim 6, wherein the RMC obtains the at least one of temperature or load information from the at least one management controller corresponding to the at least one device according to the address information of the BMC.

8. The method of claim 6, wherein controlling the fan speed is further based on the at least one of temperature or load information.

9. The method of claim 8, wherein the fan speed corresponds to one or more fans nearest to one of the at least one device.

10. The method of claim 1, wherein each of the at least one device is one of a server, a network device, a power supply unit, or a storage device.

11. The method of claim 1, wherein the RMC and the switch are a common component.

12. A method for controlling air flow in a server rack, comprising:
- storing, by a rack management controller (RMC), a connection table, a connection table comprising information for rack positions corresponding to switch ports of a switch;
- obtaining, by the switch, address information of a management controller of each of at least one device connected to the switch ports of the switch, the address information of the management controller of each device of the at least one device being corresponding to an entry of the connection table;
- obtaining, by the RMC from the switch, the address information;
- determining, by the RMC, a rack position for each of the at least one device, based on the table and the address information; and
- controlling, by the RMC, fan speed for the at least one device, based on the rack position for each of the at least one device.

13. The method of claim 12, further comprising obtaining, by the RMC, temperature information for each of the at least one device.

14. The method of claim 13, wherein the RMC obtains the temperature information from the at least one management controller corresponding to the at least one device.

15. The method of claim 13, wherein controlling the fan speed is further based on the at least one of temperature or load information.

16. The method of claim 15, wherein the fan speed corresponds to one or more fans nearest to one of the at least one device.

17. The method of claim 12, wherein the RMC and the switch are a common component.

18. A system for controlling air flow in a server rack, comprising:
- at least one device, each corresponding to a rack position in the server rack;
- a switch connected to each of the at least one device;
- a rack management controller (RMC) configured to:
  - send a request to the switch for a rack position for each of the at least one device; and
  - controlling fan speed for the at least one device, based on the rack position for each of the at least one device;
- the switch configured to:
  - store a connection table, the connection table comprising information for rack positions corresponding to switch ports of the switch;
  - obtain address information of a management controller of each of at least one device connected to the switch ports of the switch, the address information of the management controller of each device of the at least one device being corresponding to an entry of the connection table;
  - determine the rack position for each of the at least one device, based on the table and the address information; and
  - send, to the RMC, the rack position for each of the at least one device.

19. The system of claim 18, wherein the RMC comprises:
- a controller configured for rack management;
- a network interface connected to the switch; and
- a bus interface connected to at least one fan.

20. The system of claim 18, wherein the switch comprises:
- an application specific integrated circuit (ASIC); and
- at least one input/output port configured to receive the connection table.

* * * * *